Dec. 1, 1964 T. A. LONGO 3,159,770

MULTIPLE COMPONENT ELECTRICAL ENCLOSURE HAVING IDENTIFYING RING PLATE SHORT-CIRCUITING ONE COMPONENT

Filed Sept. 11, 1961

INVENTOR.
THOMAS A. LONGO

BY *David M. Keay*

AGENT.

United States Patent Office 3,159,770
Patented Dec. 1, 1964

3,159,770
MULTIPLE COMPONENT ELECTRICAL ENCLOSURE HAVING IDENTIFYING RING PLATE SHORT-CIRCUITING ONE COMPONENT

Thomas A. Longo, Winchester, Mass., assignor to Sylvania Electric Products Inc., a corporation of Delaware Filed Sept. 11, 1961, Ser. No. 137,193
6 Claims. (Cl. 317—101)

Figure 1:
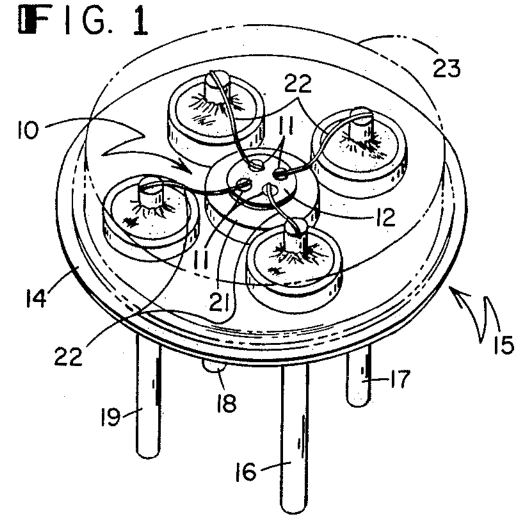

This invention relates to semiconductive electrical devices. More particularly, it is concerned with devices comprising a plurality of functionally independent semiconductor components mounted within a single enclosure.

Semiconductor devices, particularly diodes, are employed in large numbers in many complex electrical networks. Certain circuits, such as gate or "and" logic circuits require many diodes all having approximately the same electrical characteristics. If the diodes are each separate individual elements, connecting them into a circuit requires time and care in handling the elements, in determining the polarity of their leads, and in making electrical connections to the leads. The total physical space required by all the individual elements and their connections is also a problem in networks which include large numbers of components.

In order to reduce space requirements several components may be mounted within a single enclosure. Electrical leads extending through the enclosure from the components may be arranged so that the multiple component device can be inserted into a socket or a circuit board, thus making all the connections between the components and the circuitry at one time.

Advances in the semiconductor art make possible the fabrication of several functionally independent diodes of the junction type within a single block or wafer of semiconductor material. The wafer may be mounted in an enclosure and connected to the enclosure leads so as to provide a multiple diode device. The bulk region of the wafer provides a single base electrode for all the diodes and each diode has a separate rectifying electrode at the top of the wafer. Fabrication techniques permit the simultaneous fabrication of all the diodes in the wafer up to and including the step of mounting the wafer on the header of an enclosure with the base electrode in ohmic contact with the header. Contact wires are then attached from the rectifying electrode of each of the diodes to electrical leads sealed through and insulated from the header. A suitable cap or cover is then placed on the header so as to enclose the wafer, and the cap is sealed to the header.

Although all diodes in a wafer are subjected to the same fabrication steps, at the present state of the art it frequently occurs that one of the diodes in a wafer is defective, or at least has electrical characteristics which are not sufficiently similar to those of the other diodes in the wafer. After the diodes have been connected to the leads and the enclosure sealed, the internal connections to the leads are fixed. If any of the diodes are unsatisfactory, the device cannot be inserted into a socket in a previously wired circuit, since it cannot be predicted which diode will be unusable. Therefore, the entire device must necessarily be rejected even though several diodes of the device are completely satisfactory. The percentage of complete devices which are satisfactory may thus be relatively low although the percentage of satisfactory individual diodes is relatively high.

It is an object of the present invention, therefore, to provide a multiple component electrical device which is capable of being produced with an improved yield of usable devices.

It is also an object of the invention to provide an improved enclosure for a multiple component semiconductor device.

Briefly, in the devices contemplated by the present invention a plurality of similar electrical components are sealed in a conductive enclosure constituting one common electrical connection for all of the components. A like plurality of leads, one from each component, passes through insulating elements in the surface of the enclosure in a circularly symmetrical pattern. A conductive orienting member secured to the enclosure includes a portion connected to the lead extending to the least satisfactory component thus providing a short circuit around that component and establishing that lead as a connection to the enclosure and hence a common external lead to all the components. The orienting member includes means for identifying the common lead by reference to the location of such means with respect to the lead.

The orienting member is preferably planar and has a first opening adapted to receive any one of the leads of the device. It also has a second opening adapted to receive the remaining leads of the device. An orienting means such as, for example, a tab, or an extension from the periphery of the member is spaced at a predetermined location from the first opening. Thus, when the member is placed against the surface of the enclosure with one of the leads passing through the first opening and the other leads through the second opening, all of the leads are identifiable by their positions with respect to the orienting means.

Figure 2:
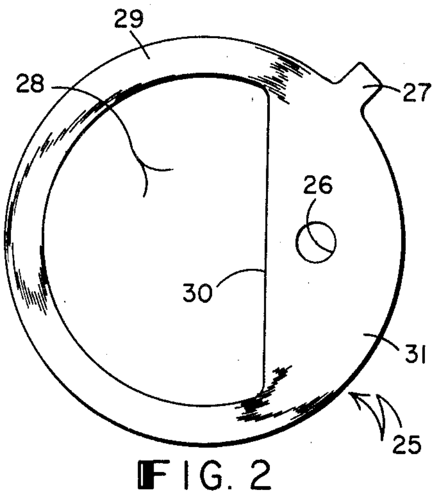
Figure 4:
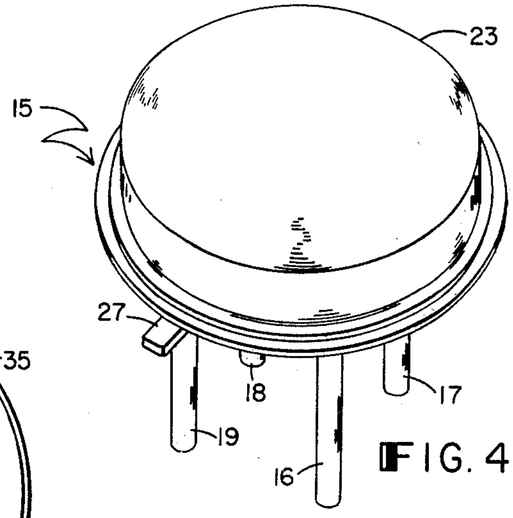
Figure 3:
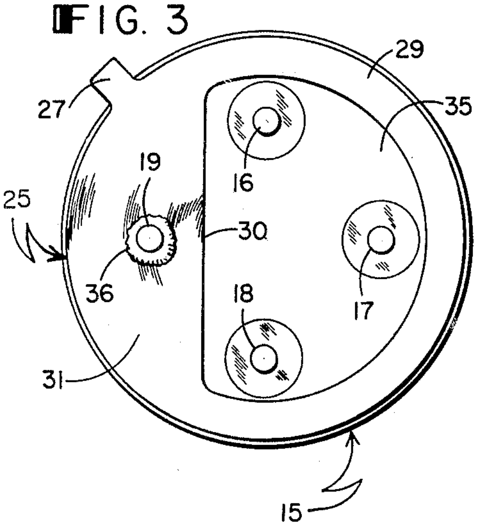

Additional objects, features, and advantages of the present invention will be apparent from the following detailed discussion and the accompanying drawings wherein:

FIG. 1 is a perspective view of an electrical device having four junction type mesa diodes fabricated within a single wafer of semiconductor material and mounted on the header of an enclosure, FIG. 2 is a plan view of an orienting member for use with the device of FIG. 1 in accordance with the invention, FIG. 3 is a bottom view of the semiconductor device of FIG. 1 showing the orienting member of FIG. 2 mounted in place thereon, and FIG. 4 is a perspective view of a completed semiconductor device according to the invention.

The semiconductor device illustrated in FIG. 1 includes a wafer 10 of semiconductor material, for example germanium, having four raised portions or mesas 11. The wafer has a base or bulk region 12 of one type of conductivity. The upper surface regions of each of the mesas is of the opposite type of conductivity. Each mesa contains a junction between the base region of the one conductivity type and one of the regions of the opposite conductivity type. The wafer therefore includes four semiconductor junction diodes each having a separate rectifying electrode consisting of the opposite type conductivity region at the top of a mesa and all having a common base electrode consisting of the bulk region of the one conductivity type. The wafer may be fabricated by various known diffusion and etching techniques in order to provide the four mesa junctions.

The wafer is mounted on the header 15 of a housing or enclosure. The header is primarily a flat circular metal plate 14. Four leads 16, 17, 18, and 19 extend through openings in the plate. The leads are sealed to the plate by means of glass beads in order to electrically insulate them from the plate and each other. The leads are equally spaced in a circular array about the center of the plate. The entire header thus displays circular symmetry about the center of the plate.

The wafer is mounted centrally of the header with the base region 12 in ohmic electrical contact with a metallic pedestal 21 attached to the header. Thus each of the diodes has its base electrode connected to the header. A contact wire 22 is attached from each of the leads to a rectifying electrode of a diode at the upper surface of a mesa. A circular cap or cover 23, as shown in phantom in FIG. 1, is then sealed to the plate of the header as by welding in order to provide a hermetically sealed enclosure for the diodes. As can be seen in FIG. 1, the resulting device is a generally cylindrical structure having circular symmetry about its center. Each of the leads provides an electrical connection to the rectifying electrode of a diode and the header itself provides the electrical connection to the common base electrode.

FIG. 2 illustrates an orienting ring for use with the device of FIG. 1. The ring is a flat metal plate 25 having an outside diameter substantially equal to the diameter of the header. A first opening 26 in the plate is located at a distance from the center of the plate equal to the distance that each of the leads is located from the center of the header. The first opening is slightly larger than the cross section of a lead. For example, with leads having a diameter of .014 inch an opening having a diameter of .020 to .025 inch is employed.

An orienting tab 27 is located at a predetermined location with respect to the first opening. As illustrated in FIG. 2, the tab is located approximately 45° from the first opening. The tab extends outward beyond the circular periphery of the plate.

A second opening 28 is also provided in the orienting ring. The second opening is sufficiently large so as to leave an annular strip 29 around the edge of more than half of the plate. The major diameter of the opening is slightly greater than the diameter of the circular array of the leads on the header. For example, with the leads arranged in a .141 inch diameter circle, the major diameter through the opening is approximately .200 inch. The edge 30 of the remaining segment 31 of the circular plate, which has the first opening, is spaced from the diameter of the plate parallel to the edge at a distance sufficient to insure that a lead located at the diameter will not contact the edge.

After the device as shown in FIG. 1 has been sealed with a cover, the individual diodes are each electrically tested in order to determine which diode is the least satisfactory and is to be made inactive. The orienting ring of FIG. 2 is then attached to the enclosure as illustrated in the bottom view of FIG. 3. The lead 19 to the diode which has been seelcted to be the inactive diode is passed through the first opening 26 in the ring and the remaining leads to the active diodes are passed through the second opening 28. The ring is placed flush against the flat bottom surface 35 of the header concentric with the surface so that the periphery of the ring is substantially in alignment with the periphery of the header. The ring is attached to the surface of the header as by welding about the periphery. In order to insure that electrical contact is established between the lead 19 to the inactive diode and the ring, a solder connection 36 is made between the lead and the portion of the ring adjacent the opening. The rectifying electrode of the inactive diode is thus shorted to the header and the common base electrode thereby establishing the lead 19 as the common base lead for all the active diodes. The configuration of the second opening insures that the remaining three leads 16, 17, and 18 to the rectifying electrodes of the active diodes are untouched by the annular strip 29 or the segment 31 of the ring.

The completed three-diode device is illustrated in perspective in FIG. 4. The four leads are arranged symmetrically in a circular array but the symmetry of the device is disrupted by the orienting tab 27. The orienting tab provides a point of reference 45° from the common base lead 19, thus positively identifying the lead. The leads to the rectifying electrodes of the three active diodes are in predetermined positions with respect to the base lead and the orienting tab. The device can, therefore, be oriented either manually, semi-automatically, or automatically so that it can be inserted into a socket or circuit board properly registered for connection in an electrical network.

Although the invention has been shown and described in conjunction with a three-active-diode semiconductor device, various modifications and deviations from the embodiment shown herein are possible without departing from the spirit and scope of the invention.

What is claimed is:

1. In combination an electrical device and a lead identifying ring, said electrical device having a plurality of electrical leads extending from a flat circular surface of the device in a circular array about the center of the said surface and spaced apart at equal distances, said ring comprising a flat metal circular plate having a diameter substantially equal to the diameter of the circular surface of the device, a first opening through said plate slightly larger than the cross-section of a lead of the device and adapted to receive any one of said leads therethrough, a second opening through said plate adapted to receive the remainder of said leads without contact between said plate and the leads upon mounting of said ring in contact with the surface of the device and concentric with the surface, and an orienting tab on said plate extending outward from the circular periphery of the plate whereby when said ring is mounted concentrically on said surface each of said leads is positively identifiable by its position relative to the orienting tab.

2. In combination an electrical device and a lead identifying ring, said device having a plurality of electrical leads extending from a flat surface of the device and arranged in a circular array about the center of the surface, the surface of the device having a configuration displaying circular symmetry about its center, said ring comprising a flat metal plate of configuration generally similar to that of the surface of the device, a first opening in said metal plate at a distance from the center of the plate equal to the distance from the center of said surface to said leads and adapted too receive any one of said leads therethrough for establishing electrical contact between the lead and the plate, a second opening in said metal plate adapted to receive the remainder of the leads of the device therethrough without contact being made between the plate and the leads when said ring is placed concentrically in contact with said surface with one of the leads through the first opening, and an orienting tab on the periphery of said plate adapted to extend beyond the periphery of the surface of the device whereby when the plate is contacting and concentric with said surface with a lead through said first opening, each of the leads is positively identifiable by its position with respect to said tab.

3. An electrical device comprising a plurality of functionally independent electrical components, an enclosure for the components, a plurality of electrical leads connected to said components, said leads extending through a surface of the enclosure in a pattern displaying circular symmetry, an orienting member of conductive material in contact with a conductive portion of said surface of the enclosure, a portion of said member making electrical connection to one of the leads, and an orienting tab on said member spaced at a predetermined distance from said portion of the member whereby all of said leads are positively identifiable by their position with respect to the orienting tab.

4. An electrical device comprising a plurality of functionally independent electrical components, an enclosure for said components, a plurality of electrical leads connected to said components, said leads extending through a surface of the device in a pattern displaying circular symmetry, an orienting member of conductive material in contact with a conductive portion of said surface of the enclosure, a first portion of said member making electrical connection to one of the leads, an opening in said member spaced from the first portion and having another of said leads extending therethrough without contact being made between the member and the lead, and an orienting means on said member providing a point of reference for said leads whereby all of said leads are positively identifiable by their position with respect to said orienting means.

5. An electrical device having a plurality of generally similar active electrical components including an enclosure for the components, a substantially flat circular outer surface on said enclosure, a plurality of leads numbering one more than the number of active components extending through the surface in a circular array about the center of the surface and spaced apart equal distances, said leads being electrically insulated from each other and from the enclosure, electrical connections within the enclosure between each of the active components and a different one of said leads, a flat, metal, circular lead identifying ring having a diameter substantially equal to the diameter of the circular surface of the enclosure mounted concentrically on said surface, a first opening in said ring slightly larger than the cross-section of each of said leads through which extends the lead not having connections to one of the active components, an electrical connection between the lead and the ring, a second opening in said ring through which extend the remainder of said leads without contact being made between the ring and the remainder of the leads, and an orienting tab on said ring extending outward from the circular periphery of the ring at a predetermined position with respect to said first opening whereby each of said leads is positively identifiable by its position relative to the orienting tab.

6. An electrical device including a plurality of diode elements; an enclosure for the diode elements; a flat, circular, conductive outer surface on said enclosure; a plurality of leads equal to the number of diode elements extending through said surface and insulated from said enclosure and from each other, said leads extending through said surface in a circular array about the center of the surface and spaced apart at equal distances; a separate electrical connection within the enclosure between the rectifying electrode of each of said diodes and a different one of said leads; mounting means supporting the diode elements within the enclosure and electrically connecting the base electrodes of each of said diode elements to said conductive outer surface of the enclosure; a flat, metal, circular lead identifying ring having a diameter substantially equal to the diameter of the circular surface of the enclosure mounted concentrically on said surface in electrical contact therewith; a first opening in said ring at a distance from the center of the ring equal to the distance from the center of said surface to said leads through which extends one of said leads; an electrical connection between the lead and the ring; a second opening in said ring through which extend the remainder of said leads without contact being made between the ring and the leads; and an orienting tab on the periphery of said ring extending beyond the periphery of the ring at a predetermined position with respect to said first opening, whereby the rectifying electrode of one of said diodes is shorted to the enclosure and each of the leads is positively identifiable by its position with respect to said tab.

References Cited in the file of this patent

UNITED STATES PATENTS

| | | |
|---|---|---|
| 1,900,732 | Place | Mar. 7, 1933 |
| 2,032,501 | Reynolds | Mar. 3, 1936 |

FOREIGN PATENTS

| | | |
|---|---|---|
| 288,731 | Great Britain | Apr. 16, 1928 |